(12) United States Patent
Weitzel et al.

(10) Patent No.: US 6,255,710 B1
(45) Date of Patent: Jul. 3, 2001

(54) 3-D SMART POWER IC

(75) Inventors: Charles E. Weitzel, Mesa; Nada El-Zein, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/072,339

(22) Filed: May 4, 1998

(51) Int. Cl.[7] .................... H01L 29/00; H01L 29/80; H01L 31/112; H01L 29/76

(52) U.S. Cl. .................... 257/501; 257/265; 257/272; 257/337; 257/500; 257/502

(58) Field of Search .................... 257/341, 500, 257/501, 502, 265, 272, 278, 337

(56) References Cited

U.S. PATENT DOCUMENTS

| | | | |
|---|---|---|---|
| 5,373,522 | 12/1994 | Holonyak, Jr. et al. | 372/45 |
| 5,400,354 | 3/1995 | Ludowise et al. | 372/46 |
| 5,473,181 | * 12/1995 | Schwalke et al. | 257/500 |

OTHER PUBLICATIONS

E. I. Chen et al., "$Al_xGa_{1-x}As$–GaAs Metal–Oxide Semiconductor Field Effect Transistors Formed By Lateral Water Vapor Oxidation of AlAs", Appl. Phys. Lett, vol. 66, No. 20, May 15, 1995, pp. 2688–2690.

* cited by examiner

*Primary Examiner*—Steven Loke
(74) *Attorney, Agent, or Firm*—Anthony M. Martinez; William E. Koch

(57) ABSTRACT

An integrated smart power circuit including a power semiconductor device fabricated on a conducting substrate with a source positioned adjacent the upper surface of the substrate, a control terminal between the upper and lower surfaces, and a drain positioned adjacent the lower surface of the substrate. A high resistance layer is formed on a portion of the upper surface of the substrate, either directly overlying or adjacent to the power device, and doped semiconductor material is positioned on the high resistance layer. Control circuitry is formed in the doped semiconductor material. The high resistance layer can be conveniently formed by growing a layer of AlAs and growing doped layers on the AlAs. The AlAs can be easily oxidized thereafter.

5 Claims, 2 Drawing Sheets

3-D SMART POWER IC

FIELD OF THE INVENTION

The present invention pertains to smart power ICs and more particularly to the fabrication of power semiconductor devices and control circuitry on the same substrate.

BACKGROUND OF THE INVENTION

Semiconductor power devices and, in particular, GaAs vertical power devices require conductive substrates so that one of the current carrying terminals (e.g. the drain) can be positioned on the reverse side. Control circuitry including field effect transistors (FETs), are generally included for controlling the power devices. However, GaAs control devices are usually fabricated using a plurality of thin epitaxial layers grown on a semi-insulating substrate. Thus, integration of the power devices and the control devices on a common substrate is not normally convenient.

In the past, integration of power and control devices has been accomplished by implanting a P-type well in an N-type substrate. Power devices are then fabricated in the conducting substrate and N-channel FETs, or control devices are fabricated in the P-type well. These circuits have poor isolation and there is a tendency to create parasitic junctions which substantially degrade the operation or require additional compensating structure. Also, the implanted wells use large amounts of substrate, so that the level of integration is very poor.

Another solution for combining power and control circuits on a common substrate is to form a large buried gate structure for the vertical power devices. The buried gate structure generally includes a p-type buried layer formed by implant, epitaxial growth etc. A portion of the buried gate structure is then used to isolate the control circuitry, which is fabricated above the portion of the buried gate structure, by including a vertical implant extending from the surface to the portion of the buried gate structure between the vertical power devices and the control devices. In this structure the buried gate and the vertical implant form a P-type isolation barrier beneath the control devices and between the control and power devices. This type of combination also has poor isolation and there is a tendency to create parasitic junctions which substantially degrade the operation or require additional compensating structure. Further, the implanted wells again use large amounts of substrate, so that the level of integration is very poor.

Thus, it would be highly desirable to provide high level integration of vertical power devices and control circuitry on a common substrate.

It is a purpose of the present invention to provide a new and improved integrated smart power IC.

It is another purpose of the present invention to provide a new and improved integrated smart power IC with improved isolation.

It is still another purpose of the present invention to provide a new and improved integrated smart power IC with a higher level of integration than prior art circuits and with reduced die size.

It is a further purpose of the present invention to provide a new and improved integrated smart power IC in which the isolation is relatively easy and inexpensive to fabricate.

SUMMARY OF THE INVENTION

The above problems and others are at least partially solved and the above purposes and others are realized in an integrated smart power circuit including a power semiconductor device fabricated on a conducting substrate with a first current carrying terminal positioned adjacent the upper surface of the substrate, a control terminal positioned between the upper and lower surfaces, and a second current carrying terminal positioned adjacent the lower surface of the substrate. A high resistance layer is formed on a portion of the upper surface of the substrate, either directly overlying or adjacent to the power device, and doped semiconductor material is positioned on the high resistance layer. Control circuitry is formed in the doped semiconductor material.

In a specific embodiment, the high resistance layer can be conveniently formed by growing a layer of AlAs and growing doped layers on the AlAs. The AlAs can be easily oxidized thereafter. In another embodiment, a layer of low temperature GaAs is formed on the upper surface of the substrate followed by an AlGaAs buffer layer and a GaAs channel layer.

BRIEF DESCRIPTION OF THE DRAWINGS

Referring to the drawings.

DESCRIPTION OF THE PREFERRED EMBODIMENTS

Figure 1:
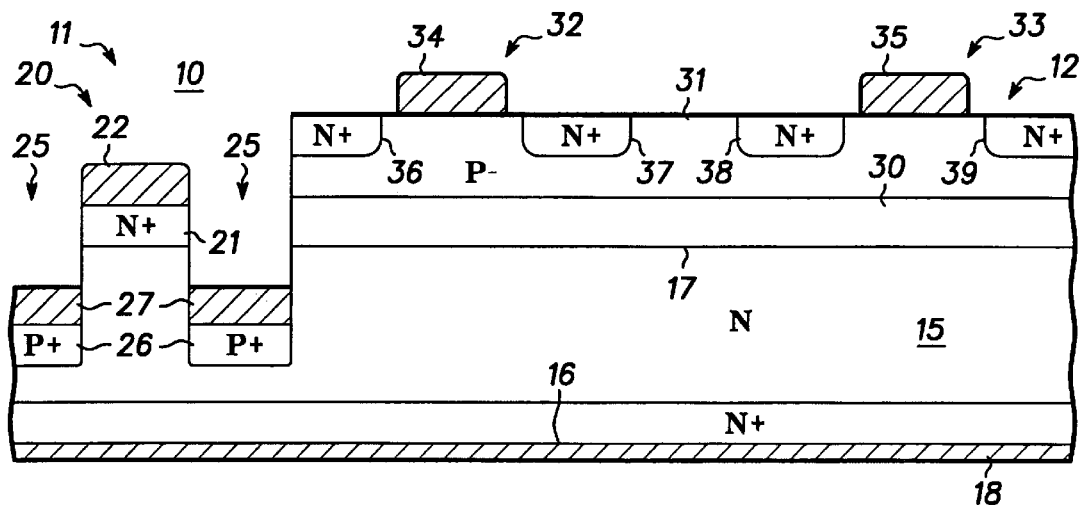
FIG. 1 is a simplified sectional view of an integrated smart power IC in accordance with the present invention.

Turning now to the drawings, FIG. 1 is a simplified sectional view of an integrated smart power IC 10 in accordance with the present invention. In this specific embodiment, integrated smart power IC 10 includes a power semiconductor device 11 (e.g. a power JFET) and control circuitry 12. Basically, integrated smart power IC 10 is fabricated on a substrate 15 having a lower or rear surface 16 and an upper or front surface 17. Substrate 15 is generally lightly doped (in this instance N-type conduction) to provide for conduction therethrough, usually referred to as a drift region and may have more heavily doped contact layers adjacent surfaces 16 and 17. In some instances additional epitaxial layers may be grown in accordance with specific fabrication techniques but all such layers are considered and will be referred to hereinafter as substrate 15.

A conductor 18, usually a metal forming an ohmic contact, is deposited on surface 16 and serves as one current terminal for power semiconductor device 11, generally a drain terminal. A current terminal 20, generally a source terminal, includes a heavily doped region 21 having a metallization layer 22 deposited thereon. Generally, the heavily doped region is formed by implantation or diffusion, depending upon the materials and process, and the metallization is formed by lift-off or any of the other techniques well known in the semiconductor industry. In the fabrication process, a trench 25 is etched into substrate 15 using standard masking techniques, so that current terminal 20 has trench 25 positioned on each side thereof. Here it should be noted that the drawings are not drawn in the correct dimensional relationship but are designed for convenience of understanding. Also, it should be noted that trench 25 may be circular, oval or race-track shaped, serpentine or any other shape designed to make the area of power semiconductor device 11 sufficiently large to produce whatever current is required. The bottom of trench 25 is heavily doped with P+ doping 26 to form a control or gate terminal which is contacted either directly, as illustrated by metallization layer 27 or at some remote point. Typically, doping 26 is achieved by implant and anneal for activation, after which metallization layers 22 and 27 are provided.

Control circuitry 12, in this specific embodiment is formed adjacent power semiconductor device 11 and in this embodiment at one edge of trench 25. A high resistance layer 30 is formed on surface 17 of substrate 15 adjacent trench 25. One or more doped semiconductor layers 31 are formed on the surface of high resistance layer 30. A plurality of control devices, e.g. field effect transistors (FETs) 32 and 33, are formed in doped semiconductor layers 31 using any convenient semiconductor technique or process. In a typical example, metal gates 34 and 35 are formed by some usual patterning process and a source and drain (e.g. 36,37 and 38, 39, respectively) are formed on either side of each gate 34 and 35 by implantation or diffusion. Metallization is then performed to connect power semiconductor device 11 and control circuitry 12 into integrated smart power IC 10.

High resistance layer 30 can include one of nitride, an oxide, and an amorphous material and can include a layer of oxidized aluminum arsenide (AlAs) deposited on substrate 15.

In a preferred embodiment, substrate 15 is formed of gallium arsenide (GaAs) and high resistance layer 30 is formed by depositing or epitaxially growing a layer of aluminum arsenide (AlAs) on surface 17 thereof. This can be accomplished relatively easily, since the crystal structures are relatively well matched. One or more semiconductor layers 31 (e.g. GaAs) can then be epitaxially grown on the surface of high resistance layer 30 using well known techniques. Either before or after the completion of control circuitry 12, the AlAs is converted to $Al_2O_3$ by low temperature oxidation. Such oxidation will proceed from the edges of layer 30 laterally if the size of the die is not too large.

While high resistance layer 30 can be formed using a variety of different processes, the above described method using AlAs is one of the most convenient. Another embodiment which can be conveniently utilized is to form a layer of low temperature GaAs on the upper surface of the substrate. The formation of low temperature GaAs is well documented and understood by those skilled in the semiconductor art. In this specific embodiment, an AlGaAs buffer layer is formed on the low temperature GaAs layer followed by a GaAs channel layer.

Figure 2:
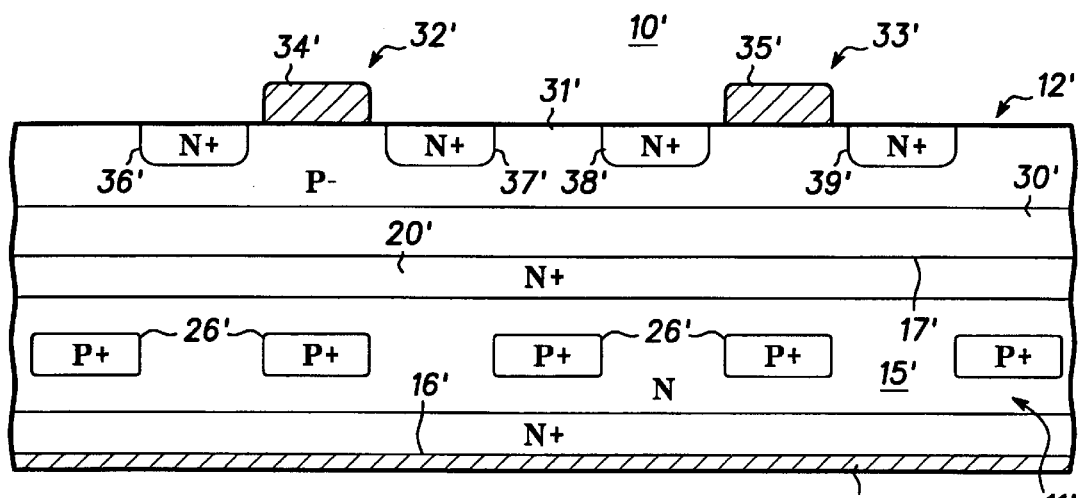
FIG. 2 is a simplified sectional view of another integrated smart power IC in accordance with the present invention.

Turning now to FIG. 2, a simplified sectional view is illustrated of another embodiment of an integrated smart power IC 10' in accordance with the present invention. Components similar to components in FIG. 1 are designated with similar numerals having a prime added to indicate the different embodiment. In this specific embodiment, integrated smart power IC 10' includes a power semiconductor device 11' (e.g. a power JFET) and control circuitry 12'. Basically, integrated smart power IC 10' is fabricated on a substrate 15' having a lower or rear surface 16', and an upper or front surface 17'. Substrate 15' is generally lightly doped (in this instance N-type conduction) to provide for conduction therethrough, usually referred to as a drift region and may have more heavily doped contact layers adjacent surfaces 16' and 17'. In some instances additional epitaxial layers may be grown in accordance with specific fabrication techniques but all such layers are considered and will be referred to hereinafter as substrate 15'.

A conductor 18', usually a metal forming an ohmic contact, is deposited on surface 16' and serves as one current terminal for power semiconductor device 11', generally a drain terminal. A current terminal 20', generally a source terminal, includes a heavily doped region or layer which may be formed by implanting or diffusing into the upper surface of substrate 15' or by epitaxially growing a doped layer on the surface of substrate 15' (the epitaxial layer being considered a portion of substrate 15' herein). A control terminal 26' is formed by providing heavily doped regions 26' (with P+ doping) positioned between lower surface 16' and upper surface 17' of substrate 15'. Regions 26' can be formed using a variety of processes including implanting, growing epitaxial layers, etc. External connections to current terminal 20' and control terminal 26' can be made through vias (not shown) or at one of the edges of integrated smart power IC 10'. Thus, one or more power semiconductor devices 11' are fabricated in substrate 15' with a planar upper surface 17'.

A high resistance layer 30' is formed on surface 17' of substrate 15' and one or more doped semiconductor layers 31' are formed on the surface of high resistance layer 30'. A plurality of control devices, e.g. field effect transistors (FETs) 32' and 33', are formed in doped semiconductor layers 31' using any convenient semiconductor technique or process. In a typical example, metal gates 34' and 35' are formed by some usual patterning process and a source and drain (e.g. 36',37' and 38', 39', respectively) are formed on either side of each gate 34' and 35' by implanting or diffusion. Metallization is then performed to connect power semiconductor device 11' and control circuitry 12' into integrated smart power IC 10'.

In a preferred embodiment, substrate 15' is formed of gallium arsenide (GaAs) and high resistance layer 30' is formed by depositing or epitaxially growing a layer of aluminum arsenide (AlAs) on surface 17' thereof. This can be accomplished relatively easily, since the crystal structures are relatively well matched. One or more semiconductor layers 31' (e.g. GaAs) can then be epitaxially grown on the surface of high resistance layer 30' using well known techniques. Either before or after the completion of control circuitry 12', the AlAs is converted to $Al_2O_3$ by low temperature oxidation. Such oxidation will proceed from the edges of layer 30' laterally if the size of the die is not too large.

Figure 3:
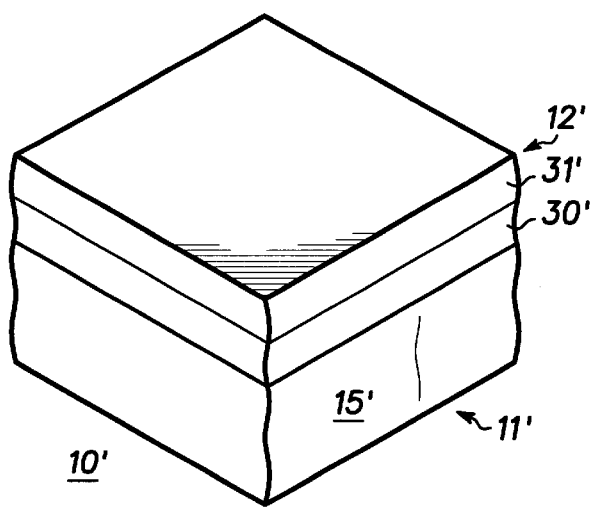
FIG. 3 is an isometric view illustrating the relationship of power and control circuits in one embodiment of an integrated smart power IC in accordance with the present invention.

Turning now to FIG. 3, an isometric is illustrated showing the relationship of power and control circuits in one embodiment (e.g. the embodiment of FIG. 2) of an integrated smart power IC in accordance with the present invention. For convenience in understanding, components which are similar to components of FIG. 2 will be designated with similar numbers in FIG. 3. Thus, integrated smart power IC 10' includes power semiconductor device 11' formed in substrate 15' and illustrated as a lower layer or block in FIG. 3. High resistance layer 30' is formed on substrate 15' and control circuitry 12' is formed in a layer or layers overlying high resistance layer 30'. To better understand the fabrication of integrated smart power IC 10', some specific examples are set forth below.

In a first specific example and referring to FIG. 3, layer 30' is 800 Å thick with a rectangular area of 100 mils by 100 mils. Generally, the thickness is in a range of 500 Å to 1000 Å thick to provide good isolation without requiring too much space. A point that should be understood is that as layer 30' is made thicker, there is a tendency to oxidize quicker because of the improved access. With the structure of FIG. 3 in an oxygen or moisture laden atmosphere, an oxidation temperature of 440° C. to 450° C. is sufficient to oxidize the rectangular mesa in approximately 20 to 30 minutes.

Figure 4:
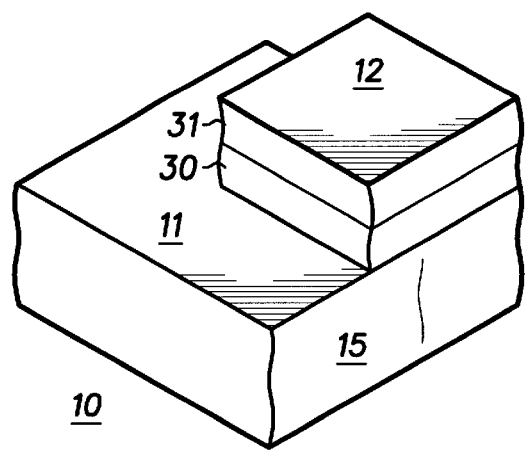
FIG. 4 is an isometric view illustrating the relationship of power and control circuits in another embodiment of an integrated smart power IC in accordance with the present invention.
Figure 5:
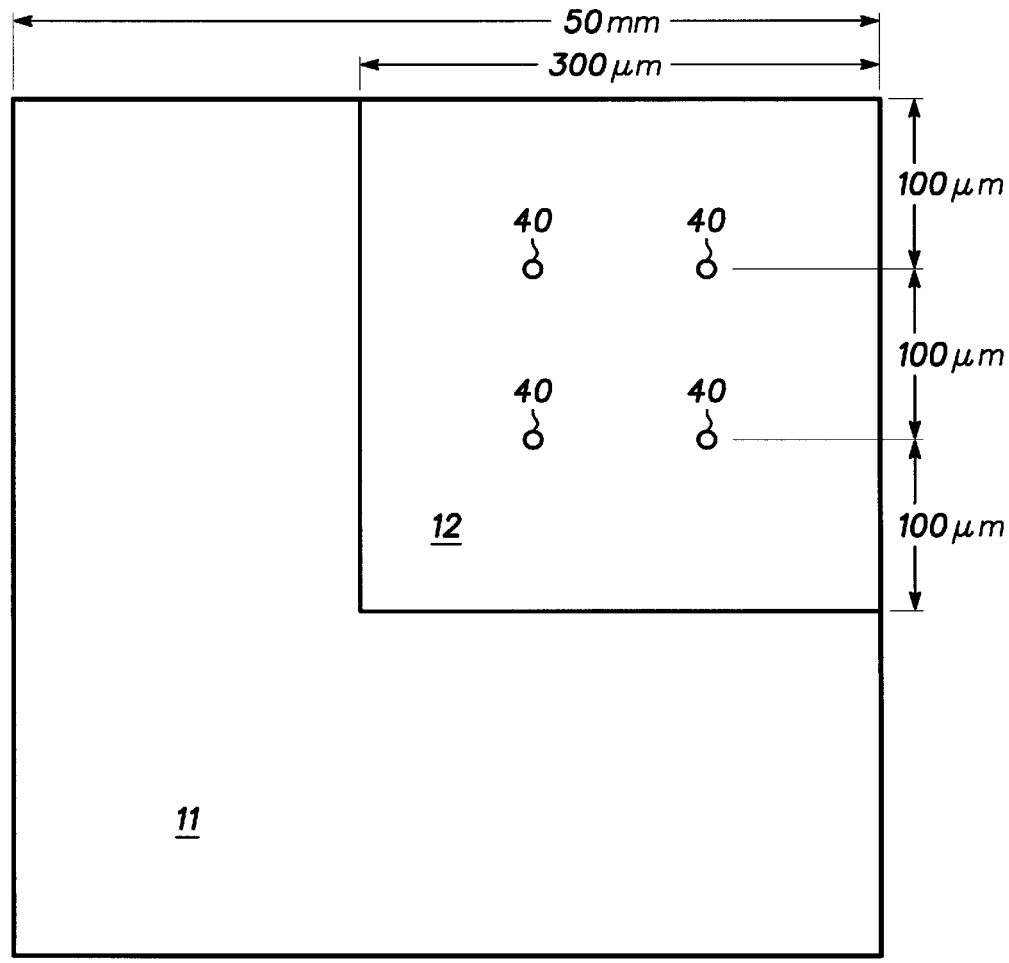
FIG. 5 is a view in top plan of an embodiment similar to the embodiment of FIG. 4.

Turning now to FIGS. 4 and 5, an isometric and top plan view, respectively, are illustrated showing the relationship of power and control circuits in the embodiment illustrated in FIG. 1 of integrated smart power IC 10 in accordance with the present invention. For convenience in understanding, components which are similar to components of FIG. 1 will be designated with similar numbers in FIG. 4. Thus, integrated smart power IC 10 includes power semiconductor device 11 formed in substrate 15 and illustrated as a lower layer or block in FIG. 3. High resistance layer 30 is formed on substrate 15 and control circuitry 12 is formed in a layer or layers overlying high resistance layer 30. Layer 30 and layer or layers 31 can be deposited or grown in blanket form, if desired, and patterned or formed into the mesa illustrated in FIG. 4 by etching. In a specific embodiment an etch solution of $H_3PO_4:H_2O_2:H_2O$ is used in a 1:8:140 ratio. However, a sulfuric etch solution could be used instead, if desired. In this specific etch $H_2SO_4:H_2O_2:H_2O$ is used in a 1:1:40 ratio.

Turning specifically to FIG. 5, the final mesa is illustrated as being in a rectangular shape 300 µm by 300 µm, which it has been determined is too large to reliably oxidize all of layer 30 in a reasonable time. Thus, oxidation vias 40 are etched or otherwise formed at approximately 100 µm intervals. In this specific example, oxidation vias 40 are formed with approximately a 10 µm diameter. It will of course be understood that the diameter is selected to provide the most reliable oxidation while requiring the least amount of area. In this example layer 30 was subjected to approximately 440° C. to 450° C. in an oxygen atmosphere for about 25 to 45 minutes.

Thus, a new and improved integrated smart power IC is disclosed with improved isolation, a higher level of integration than prior art circuits, and with reduced die size. That is, the control circuits can be fabricated in overlying relationship (three dimensional) to the power devices so that chip area is minimized. Further, the new and improved integrated smart power IC is fabricated by processes in which isolation is relatively easy and inexpensive to fabricate.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated smart power circuit comprising:

a conducting substrate having an upper and a lower surface;

a power semiconductor device fabricated on the substrate and including a first current carrying terminal positioned adjacent the upper surface of the substrate, a control terminal, and a second current carrying terminal positioned adjacent the lower surface of the substrate;

a high resistance layer formed on a portion of the upper surface of the substrate;

doped semiconductor material positioned on the high resistance layer;

control circuitry formed in the doped semiconductor material;

wherein the high resistance layer includes one of a nitride, an oxide, and an amorphous material;

wherein the high resistance layer includes aluminum oxide; and wherein the aluminum oxide includes a layer of oxidized AlAs deposited on a gallium arsenide substrate.

2. An integrated smart power circuit comprising:

a conducting substrate having an upper and a lower surface;

a power semiconductor device fabricated on the substrate and including a first current carrying terminal positioned adjacent the upper surface of the substrate, a control terminal, and a second current carrying terminal positioned adjacent the lower surface of the substrate;

a high resistance layer formed on a portion of the upper surface of the substrate;

doped semiconductor material positioned on the high resistance layer;

control circuitry formed in the doped semiconductor material;

wherein the high resistance layer includes one of a nitride, an oxide, and an amorphous material; and wherein the high resistance layer includes low temperature gallium arsenide deposited on a gallium arsenide substrate.

3. An integrated smart power circuit comprising:

a conducting gallium arsenide substrate having an upper and a lower surface;

a vertical power transistor fabricated on the substrate and including a first current carrying terminal positioned adjacent the upper surface of the substrate, a gate terminal, and a second current carrying terminal positioned adjacent the lower surface of the substrate;

a high resistance layer formed on a portion of the upper surface of the substrate, the high resistance layer including one of aluminum oxide and low temperature gallium arsenide;

doped semiconductor material positioned on the high resistance layer; and control circuitry, including a plurality of lateral field effect transistors, formed in the doped semiconductor material.

4. An integrated smart power circuit as claimed in claim 3 wherein the aluminum oxide includes a layer of oxidized AlAs deposited on the gallium arsenide substrate.

5. An integrated smart power circuit as claimed in claim 3 wherein the high resistance layer and the doped semiconductor material with the control circuitry formed therein are positioned in overlying relationship to at least a portion of the power semiconductor device.

* * * * *